(12) United States Patent
King

(10) Patent No.: US 6,242,916 B1
(45) Date of Patent: Jun. 5, 2001

(54) PARTIAL FOURIER ACQUISTION OF MR DATA OVER A LIMITED FIELD OF VIEW AND IMAGE RECONSTRUCTION

(75) Inventor: Kevin F. King, New Berlin, WI (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/441,799

(22) Filed: Nov. 17, 1999

(51) Int. Cl.$^7$ .................................................. G01V 3/00
(52) U.S. Cl. ........................ 324/309; 324/307; 324/312; 324/318
(58) Field of Search ................................. 324/309, 307, 324/312, 318; 600/420, 410

(56) References Cited

U.S. PATENT DOCUMENTS 6,166,545 * 12/2000 Polzin ................................ 324/309

OTHER PUBLICATIONS

Margosian, P., Faster MR Imaging with Half the Data, Health Care Communications vol. 1: pp. 195–197.*

*Fast Imaging Using Subencoding Data Sets from Mulsiple Detectors*, MRM 30:142–145 (1993), J.B. Ra, C.Y. Rim.

*An Algorithm For Rapid Image Acquisition Using Multiple Receiver Coils*, Proc. 8$^{th}$ SMRM, Amsterdam, 1989, Kelton, et al.

*Coil Sensitivity Encoding for Fast MRI*, Proc. 6$^{th}$ JSMRM, 1998, Pruessmann, et al.

*Homodyne Detection in Magnetic Resonance Imaging*, IEEE Transactions on Medical Imaging, vol. 10, No. 2, Jun. 1991, Noll, et al.

* cited by examiner

Primary Examiner—Christine Oda
Assistant Examiner—Brij B. Shrivastav
(74) Attorney, Agent, or Firm—Quarles & Brady, LLP; Christan G. Cabou

(57) ABSTRACT

Two incomplete k-space data sets are acquired with an MRI system using two surface coils. The data from the two surface coils is combined in a Sense process to reduce aliasing artifacts in the reconstructed image. The incomplete k-space data is filled out using a modified Homodyne reconstruction method which preserves phase information for the Sense process.

16 Claims, 3 Drawing Sheets

PARTIAL FOURIER ACQUISTION OF MR DATA OVER A LIMITED FIELD OF VIEW AND IMAGE RECONSTRUCTION

BACKGROUND OF THE INVENTION

The field of the invention is nuclear magnetic resonance imaging methods and systems. More particularly, the invention relates to the acquisition of partial data sets from limited fields of view and the reconstructing of images from such data sets.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well-known reconstruction techniques.

The present invention will be described in detail with reference to a variant of the well-known Fourier transform (FT) imaging technique, which is frequently referred to as "spin-warp". The spin-warp technique is discussed in an article entitled "Spin-Warp NMR Imaging and Applications to Human Whole-Body Imaging" by W. A. Edelstein et al., *Physics in Medicine and Biology*, Vol. 25, pp. 751–756 (1980). It employs a variable amplitude phase encoding magnetic field gradient pulse prior to the acquisition of NMR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of views that are acquired during the scan to sample so-called "k-space" and thereby produce a set of NMR data from which an image can be reconstructed. The phase encoding gradient $G_y$ steps from a negative value through zero to a corresponding positive value to sample k-space symmetrically around its origin.

Most NMR scans currently used to produce medical images require many minutes to acquire the necessary data. The reduction of this scan time is an important consideration, since reduced scan time increases patient throughput, improves patient comfort, and improves image quality by reducing motion artifacts.

One method for reducing scan time is to reduce the total number of views acquired during the scan. The present invention relates to two such methods. One of these methods is to acquire only a portion of the views by sampling only a portion of k-space. Instead of sampling k-space symmetrically around the origin, only spatial frequencies on one side of the origin plus a small amount near the origin on the opposite side are sampled. For example, instead of stepping $G_y$ through 128 values ranging from −64 to +64, only the views ranging from −64 to +8 are acquired. As a result, fewer views are acquired which shortens scan time, but some k-space space data is missing from the acquired data set.

Such "partial" Fourier data acquisition usually uses Hermitian conjugate symmetry to replace the missing k-space data. Hermitian conjugate symmetry only works if the image is real. Numerous phase errors are present in MRI data that make the image complex. These phase errors result from phenomena such as B0 inhomogeneity, gradient eddy currents, group delays in the gradient amplifiers and receive electronics, and the spatial variation of surface coil receive B1 fields. To enable Hermitian conjugate replacement to work with a complex image, the replacement of the missing k-space data is accompanied by a phase correction which removes the phase errors from this data. One partial Fourier reconstruction algorithm, called "Homodyne reconstruction", uses two filters to accomplish the Hermitian conjugate replacement and the phase correction, respectively. A Homodyne high pass filter doubles the amplitude of the acquired k-space data which is conjugate to the missing k-space data prior to the Fourier transform. After the Fourier transform, the imaginary part of the image is discarded to complete the replacement step. The phase correction step is accomplished by a Homodyne low pass filter. This filter creates an image from a small portion of k-space data acquired symmetrically around the center of k-space. The phase of this image is subtracted from the phase of the Homodyne high pass filtered image prior to discarding the imaginary part of the image.

Another method for shortening the scan time without changing image resolution is to reduce the field of view of the acquired image. This enables fewer views to be acquired with a corresponding reduction in scan time. If the object being imaged extends beyond the field of view, however, aliasing, or wrap-around occurs in the phase encoding direction. To use this method to shorten scan time, therefore, a technique for suppressing, or canceling, the signals from spins outside the field of view must be used.

One technique for canceling signals outside the field of view is referred to as the "sense" technique. The sense technique employs two or more receiver coils which acquire two, separate, NMR signals from the region of interest. These two acquired NMR signals can be processed in combination with the known receive field function of each coil to produce an NMR signal without wrap-around. However, for this technique to function properly, the two acquired NMR signals must be complex signals containing both real and imaginary components.

There are applications where it is desirable to use both the partial k-space acquisition technique in combination with the sense technique. Unfortunately, however, the NMR signals produced by the Homodyne reconstruction must be stripped of their imaginary components because of the spurious phase shifts produced by this reconstruction method. Without two complex NMR signals to work with, the sense technique cannot be used.

SUMMARY OF THE INVENTION

The present invention enables one to combine the Homodyne reconstruction of partial k-space data sets with the Sense process of removing image artifacts from MR images. More particularly, partial k-space data sets are acquired with an MR system using a pair of RF coils and receiver channels; the partial k-space data sets are each filled with complex conjugate data and employed to reconstruct two images; the two reconstructed images are used to calculate a single image $I_H$ in which aliasing artifacts are removed; the central region of each k-space data set is employed to produce two low frequency images; the two low frequency images are used to calculate a single image $I_L$ in which aliasing artifacts are removed; and the image $I_L$ is used to correct phase errors in the image $I_H$.

DESCRIPTION OF THE PREFERRED EMBODIMENT

Figure 1:
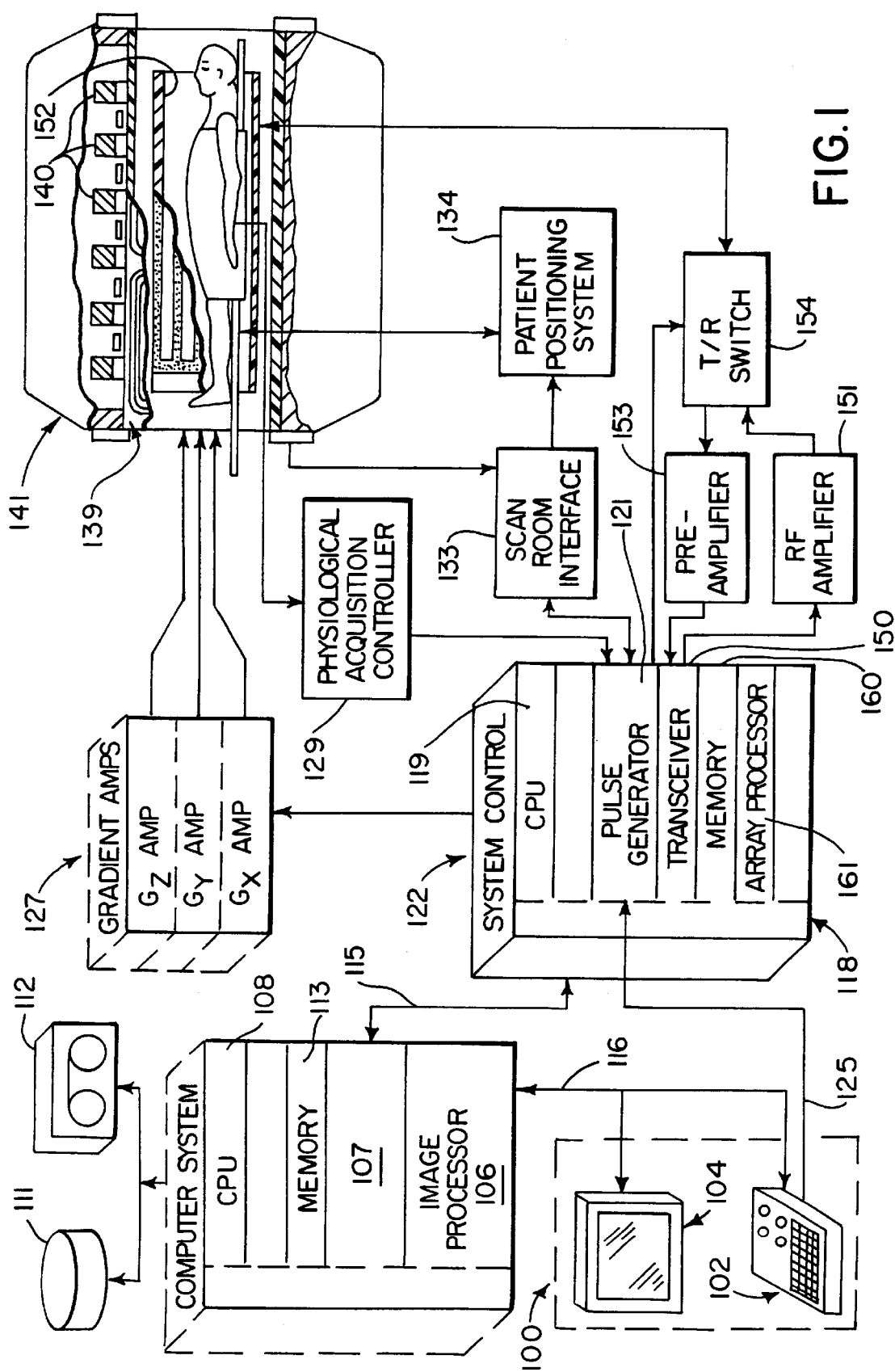
FIG. 1 is a block diagram of a known MRI system which has been modified to employ the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables separate RF surface coils to be connected to separate receiver channels in the transceiver module 150. The T/R switch 154 may thus be operated by the pulse generator 121 to produce an RF excitation field $B_1$ with the whole body RF coil 152, and then acquire NMR echo signals simultaneously with the two separate surface coils.

The NMR signals picked up by the separate surface coils are digitized by the transceiver module 150 and transferred to a memory module 160 in the system control 122. When the scan is completed the two acquired k-space data sets are processed as described in detail below using an array processor 161 to produce an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
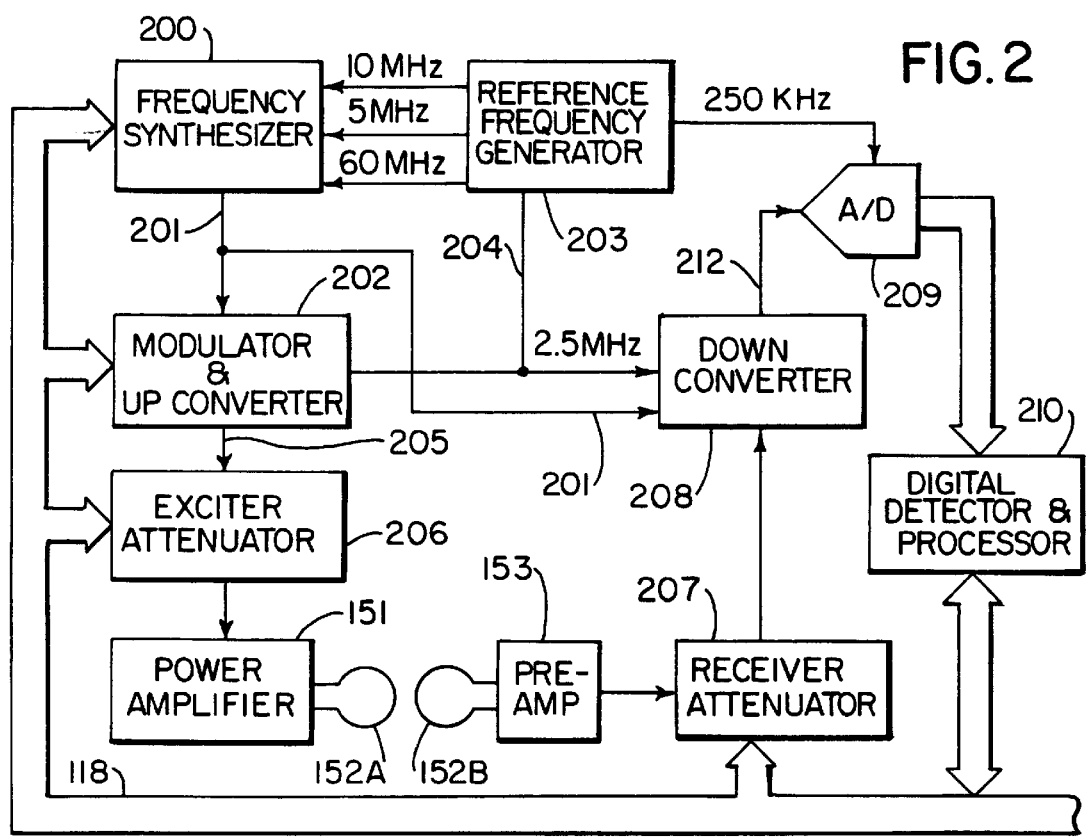
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at coil 152A and receives the resulting signal induced in a coil 152B. In the preferred embodiment transmit coil 152A corresponds to the whole body coil 152 and the receive coil 152B is a local surface coil. The base, or carrier, frequency of the RF excitation field is produced under control of a frequency synthesizer 200 which receives a set of digital signals (CF) from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2 the signal produced by the subject is picked up by the receiver coil 152B and applied through the preamplifier 153 to a receiver channel. One such receiver channel is shown in FIG. 2, but the MRI system has two such receiver channels for acquiring and digitizing NMR signals from two separate RF surface coils.

The received NMR signal is input to a receiver attenuator 207 having a gain set by a control signal received from backplane 118. The NMR signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are complex samples of the acquired NMR signal which are output through backplane 118 to the memory module 160 where they are employed to reconstruct an image as will be described in detail below.

The 2.5 Mhz reference signal as well as the 250 kHz sampling signal and the 5, 10 and 60 Mhz reference signals are produced by a reference frequency generator 203 from a common 20 Mhz master clock signal. For a more detailed description of the receiver, reference is made to U.S. Pat. No. 4,992,736 which is incorporated herein by reference.

Figure 3:
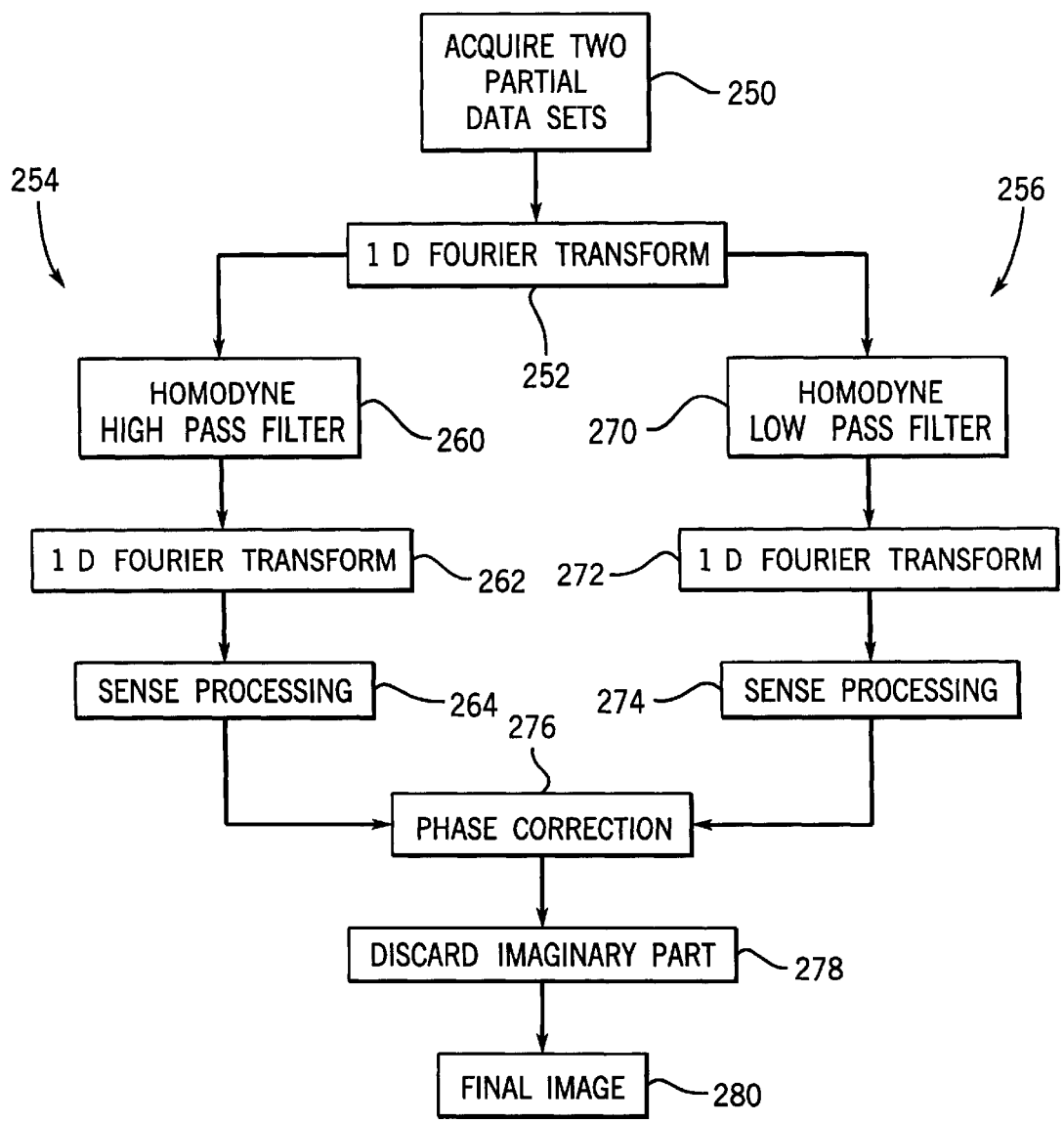
FIG. 3 is a flow chart of the steps employed in the preferred embodiment of the invention to produce an image with NMR data acquired using the MRI system of FIG. 1.

Referring particularly to FIG. 3, the present invention includes the acquisition of two partial k-space data sets as indicated at process block 250. These partial k-space data sets may be acquired using any of a number of well-known pulse sequences that are performed under the direction of the pulse generator module 121. Partial k-space data sets are acquired either to reduce the number of phase encoding views acquired during the scan, or to reduce the echo time (TE) of the pulse sequence used in the scan. In the former case, k-space is partially sampled along the phase encoding axis, and in the latter case, k-space is partially sampled along the readout axis. Two such partial k-space data sets are acquired simultaneously using two separate surface coils as described above. The surface coils are positioned to acquire NMR signals from the region of interest defined by the field of view of the prescribed scan.

The two partial data sets are processed using a combination of the Homodyne reconstruction method and the Sense processing method. First, both partial k-space data sets are Fourier transformed along the completely sampled k-space axis as indicated at process block 252. One copy of each Fourier transformed data set is processed in a series of steps indicated at branch 254. The central k-space data from the same two Fourier transformed data sets is also processed by a series of steps indicated at branch 256. The two branches 254 and 256 are required by the Homodyne reconstruction method. In branch 254 the missing k-space data is produced and in branch 256 phase data is produced which is required to correct errors in the missing data produced in branch 254.

Referring still to FIG. 3, the two partial data sets are each applied to a Homodyne high pass filter indicated at process block 260. This high pass filter doubles the amplitudes of data samples at k-space locations, or spatial frequencies conjugate to the missing data samples. The resulting "filled" data sets are then each Fourier transformed along the incompletely sampled k-space axis as indicated at process block 262. The result is two complete image data sets which contain phase errors caused by the Homodyne high pass filter process 260.

As indicated by process block 264, the next step is to employ the Sense process to calculate a single image using the two filled image data sets. For simplicity, the Sense processing is considered only for the phase encoding direction (y axis in the preferred embodiment). However, it will be understood that it can be applied in the readout direction as well. If the receive field of the surface coil is B1(y), and the ideal spin density distribution, including $T_1$ and $T_2$ weighting factors is M(y), then the acquired image I(y) is:

$$I(y)=B1(y)M(y). \quad (1)$$

With surface coils, B1(y) typically varies in both magnitude and direction as a function of location along the y axis. The directional variation means that B1(y) is actually a complex function.

In MR imaging, aliasing or replication occurs in the phase encoded direction. The replication distance is the same as the field of view. If the field of view is chosen to be D, and the object is completely contained within this field of view, the replicates of the object do not overlap and no artifact results. If the field of view is reduced in the y direction by a factor of two, the scan time is also correspondingly reduced by a factor of two. However, now the reconstructed image is aliased or replicated in the y direction at multiples of D/2 and replicates may now overlap in the field of view and produce artifacts which cause a loss of diagnostic utility. Mathematically, the image intensity is now $$I(y)=B1(y)M(y)+B1(y+D/2)M(y+D/2), \quad (2)$$

For 0<y<D/2. Equation (2) holds for each surface coil separately. For the two surface coils we have two equations:

$$I_1(y)=B1_1(y)M(y)+B1_1(y+D/2)M(y+D/2), \quad (3)$$

and $$I_2(y)=B1_2(y)M(y)+B1_2(y+D/2)M(y+D/2), \quad (4)$$

where the subscript indicates the coil number. Equations (3) and (4) can be solved to obtain M(y) and M(y+D/2), if $B1_1(y)$ and $B1_2(y)$ are known. The receive fields $B1_1(y)$ and $B1_2(y)$ are determined in separate calibration scans in which the same NMR signals are acquired with the whole body RF coil 152 and the two surface coils. The complex field $B1_1(y)$ and $B1_2(y)$ of the surface coils are obtained by taking the ratio of the complex images produced by the whole body coil 152 and the surface coil. Knowing $B1_1(y)$ and $B1_2(y)$, the spin density image M(y) may be calculated as follows:

$$M(y) = \frac{B_2(y+D/2)I_1(y)-B_1(y+D/2)I_2(y)}{B_1(y)B_2(y+D/2)-B_1(y+D/2)B_2(y)} \quad (5)$$

$$M(y+D/2) = \frac{-B_2(y)I_1(y)+B_1(y)I_2(y)}{B_1(y)B_2(y+D/2)-B_1(y+D/2)B_2(y)}$$

where $I_1$ and $I_2$ are images from each coil processed with the high pass filter.

As a result of the Sense processing 264, therefore, a complete image $I_H$ is produced in which aliasing artifacts have been removed. However, as discussed above this image $I_H$ contains phase errors due to the Homodyne high pass filter step 260 which must be removed.

Referring still to FIG. 3, the removal of the phase errors is accomplished by branch 256. The data from the central region of k-space in each of the two acquired data sets is applied to a Homodyne low pass filter 270. For example, if the partially acquired k-space axis extends from −64 to +64, and samples −64 through +8 are acquired during the scan, then the central region of k-space extending from −8 to +8 is used. The Homodyne low pass filter removes the asymmetrically acquired samples from −61 to −8.

The low pass filtered data in each data set is then Fourier transformed in the phase encoding direction as indicated at process block 272 to produce two low pass filtered images.

The two low pass filtered images are Sense processed as indicated at process block 274. The Sense process 274 is identical to the Sense process 264 described above and a single image $I_L$ is produced. This image $I_L$ contains the phase information needed to correct the filled image $I_H$.

The phase correction is made to the filled image $I_H$ at process block 276. This is accomplished by subtracting the phase at each pixel in the low pass filtered image $I_L$ from the phase of the corresponding pixel in the filled image $I_H$. The resulting complex image includes a real and an imaginary component at each pixel location, and the imaginary components are discarded at process block 278. The result is a final image 280 comprised of the real components.

It should be apparent to those skilled in the art that many variations are possible from the preferred embodiment described above without departing from the spirit of the invention. More than two receive coils may be used and the field of view can be reduced by a factor other than two. If N coils are used, the field of view can be reduced by any fraction between 1/N and 1.0. Instead of using the high pass filter described above, the missing data may be "filled" with the complex conjugate of the sampled k-space data at the conjugate frequencies. For example, fill missing samples $S(k_x)$ with the conjugate of the samples $S(-k_x)$, where S is the raw k-space data.

What is claimed is:

1. A method for producing an image with a magnetic resonance imaging system, the steps comprising:
   a) performing a series of pulse sequences to produce a corresponding series of NMR signals;
   b) acquiring the series of NMR signals with a pair of coils to produce a first partial k-space data set and a second partial k-space data set;
   c) producing a pair of complete image data sets by filling the first and second partial k-space data sets with complex conjugate data and Fourier transforming the filled k-space data sets;
   d) calculating a single image $I_H$ from the pair of complete image data sets;
   e) producing a pair of low frequency images from the respective central k-space regions in the first and second partial k-space data sets;
   f) calculating a single image $I_L$ from the pair of low frequency images;
   g) producing an output image by correcting the phase of the image $I_H$ with information in the image $I_L$.

2. The method as recited in claim 1 in which step g) is performed by subtracting the phase of pixels in the image $I_L$ from the phase of corresponding pixels in the image $I_H$.

3. The method as recited in claim 1 in which step c) includes performing a Homodyne high pass filtering operation.

4. The method as recited in claim 1 in which step c) includes:
   i) Fourier transforming the first and second partial k-space data sets along one axis;
   ii) performing a Homodyne high pass filtering operation on each of the first and second Fourier transformed partial k-space data sets; and
   iii) Fourier transforming the first and second data sets resulting from step ii) along a second axis.

5. The method as recited in claim 1 in which step e) includes performing a Homodyne low pass filtering operation.

6. The method as recited in claim 1 in which step e) includes:
   i) Fourier transforming the central k-space regions of the first and second partial k-space data sets;
   ii) performing a Homodyne low pass filtering operation on each of the first and second Fourier transformed central regions of the partial k-space data sets; and
   iii) Fourier transforming the first and second data sets resulting from step ii) along a second axis.

7. The method as recited in claim 1 in which step d) is a Sense processing operation in which the receive field of each of said coils is a factor.

8. The method as recited in claim 7 which includes positioning said two coils such that they acquire NMR signals from a region of interest.

9. The method as recited in claim 7 in which the two coils are surface coils and their receive fields overlap in a region of interest being imaged.

10. The method as recited in claim 1 in which step g) includes:
    i) changing the phase of each pixel value in the image $I_H$ by subtracting the phase of the corresponding pixel value in the image $I_L$; and
    ii) producing the output image from a real component of each pixel value in the changed image $I_H$.

11. The method as recited in claim 1 in which step f) is a Sense processing operation in which the receive field of each of said coils is a factor.

12. The method as recited in claim 11 in which the two coils are surface coils and their receive fields overlap in a region of interest being imaged.

13. A method for performing a Homodyne reconstruction of two partial k-space data sets acquired with a magnetic resonance imaging system, the steps comprising:
    a) Homodyne high pass filtering each of two partial k-space data sets to produce two complete image data sets containing phase errors and aliased information;
    b) calculating a single image data set $I_H$ from the two complete image data sets in which the aliased information is removed;
    c) Homodyne low pass filtering a central k-space region in each of two partial k-space data sets to produce two low frequency image data sets containing aliased information;
    d) calculating a single low frequency image data set $I_L$ from the two low frequency image data sets in which the aliased information is removed; and
    e) producing an output image by removing the phase errors from the single image data set $I_H$ using information in the single low frequency image data set $I_L$.

14. The method as recited in claim 13 in which the image data sets $I_H$ and $I_L$ each include an array of complex values and step e) is performed by changing the phase indicated by the complex values in the image data set $I_H$ by amounts indicated by the phase of corresponding complex values in the image data set $I_L$.

15. The method as recited in claim 13 which includes:
    acquiring the two partial k-space data sets using two separate RF surface coils having respective receive fields $B1_1$ and $B1_2$.

16. The method as recited in claim 15 in which the calculations in steps b) and d) employ the coil receive fields $B1_1$ and $B1_2$.

* * * * *